Figure 1:
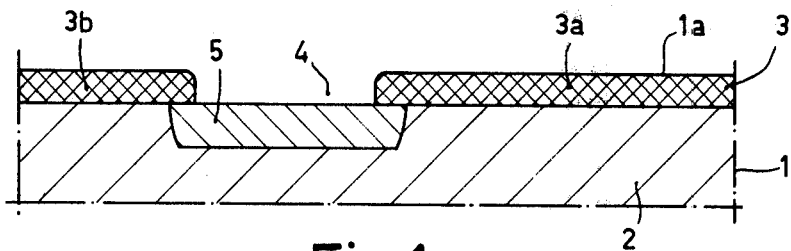

United States Patent [19]

Rioult et al.

[11] 4,035,206

[45] July 12, 1977

[54] METHOD OF MANUFACTURING A SEMICONDUCTOR DEVICE HAVING A PATTERN OF CONDUCTORS

[75] Inventors: Jean Pierre Rioult, Epron; Raymond Fabien, Douvres la Delivrande, both of France

[73] Assignee: U.S. Philips Corporation, New York, N.Y.

[21] Appl. No.: 612,857

[22] Filed: Sept. 12, 1975

[30] Foreign Application Priority Data

Sept. 18, 1974 France .............................. 74.31521

[51] Int. Cl.² ...................................... H01L 21/441
[52] U.S. Cl. ............................. 156/628; 156/656; 156/659; 204/32 R; 204/38 A
[58] Field of Search ............... 156/3, 8, 13, 18, 11, 156/17; 427/89, 90; 96/36.2; 204/15, 32 S, 33, 38 A, 42, 58, 32 R

[56] References Cited

U.S. PATENT DOCUMENTS

| | | | |
|---|---|---|---|
| 3,642,548 | 2/1972 | Eger | 156/8 |
| 3,759,798 | 9/1973 | Graff et al. | 204/38 A |
| 3,778,689 | 12/1973 | Bodway | 204/38 A |
| 3,825,453 | 7/1974 | Black et al. | 156/3 |
| 3,827,949 | 8/1974 | Platter et al. | 204/15 |

*Primary Examiner*—Douglas J. Drummond
*Assistant Examiner*—Jerome W. Massie
*Attorney, Agent, or Firm*—Frank R. Trifari

[57] ABSTRACT

A method of manufacturing a semiconductor device having a pattern of conductors, according to which method an auxiliary layer is formed which consists of two different sub-layers in which the negative of the desired pattern is provided and which is covered with a metal layer, in which the auxiliary layer and the said metal layer are then removed selectively.

The method is characterized in that the auxiliary layer comprises a lowermost layer of an anodically oxidizable metal and an uppermost layer of the oxide of the said metal and may be used in the manufacture of semiconductor devices, especially transistors for very high frequencies and integrated circuits.

7 Claims, 6 Drawing Figures

METHOD OF MANUFACTURING A SEMICONDUCTOR DEVICE HAVING A PATTERN OF CONDUCTORS

The present invention relates to a method of manufacturing a semiconductor device comprising a semiconductor body having a pattern of conductors, in which on a surface of the device an auxiliary layer is provided which has at least two sub-layers of which the lower-most extends between the semiconductor body and the uppermost sub-layer, the materials of the sub-layers differing from each other and from that of the said pattern, the auxiliary layer having at least one recess in the form of the said pattern, a conductive layer of the material of the pattern being provided over the auxiliary layer and in the recess or recesses, the part of the conductive layer present on the auxiliary layer being removed by the selective dissolution of at least a part of the auxiliary layer, the part of the conductive layer present in the recess or recesses remaining as the pattern.

The present invention also relates to devices manufactured according to said method.

As is known, the contacts to various zones of transistors and/or integrated circuits formed in apertures or windows in the insulating protecting layer present on the semiconductor surface and the conductor tracks which extend across the said insulating layer are often realised in a single conductor pattern.

In a known method, a mask is provided on the surface covered with the insulating layer having apertures, which mask is in the form of a composite auxiliary layer which consists of two layers of different materials and in which one or more recesses are provided the circumference of which follows that of the conductor pattern to be provided. In this method, the etching treatment by which the recesses have been obtained is carried out so that at the edges of the said recesses the uppermost sub-layer of the mask projects beyond the lowermost sub-layer.

Deposited on said mask is a layer of the semi-conductor material of which the said pattern is to consist, said conductive layer extending partly on the mask and partly in the recesses of the mask. By etching or selective dissolution, the lowermost sub-layer of the mask is removed, the uppermost sub-layer of the mask and the part of the conductive layer present thereon also disappearing.

For the two sub-layers of the auxiliary layer may be used, for example, two metals, for example, aluminum for the lowermost sub-layer and chromium for the uppermost sub-layer. Experience teaches that the dimensions of the projecting part of the uppermost sub-layer depend on the adherence of the material of the said sub-layer to the material of the lowermost sub-layer. Although said adherence may be good, as is usually the case with chromium on aluminum, irregularities in the projecting part occur nevertheless.

Furthermore it is known that it is difficult to form contacts on semiconductor devices of composite semiconductor materials, in particular $A_{III}B_V$ compounds, containing at least an element of the third column of the Table of Mendeleev and at least one element of the fifth column of said Table.

It is the object of the invention to provide a particularly suitable method of providing contacts and/or conductor tracks. The invention is based inter alia on the recognition of the fact that the adherence of the oxide layers obtained by anodic oxidation of a metal layer can be particularly good.

A method of the kind described in the preamble is characterized according to the invention in that the auxiliary layer comprises a sub-layer of an anodically oxidisable material, the uppermost sub-layer being obtained by subjecting the sub-layer of anodically oxidisable material to an anodic oxidation treatment.

The anodic oxidation treatment is preferably carried out locally in which the anodically oxidisable sub-layer is maintained at the area of the conductor pattern to be provided, while the remainder of the surface of said sub-layer is provided with an oxide layer, after which the anodically oxidisable sub-layer is removed by selective etching at the area of the pattern to be provided so as to obtain the recess.

Any anodically oxidisable material may be used for the lowermost auxiliary layer, titanium, tantalum, zirconium and in particular aluminum being particularly suitable. The choice of the material used depends on the substrate and on the selective etching treatment to be carried out, because the solution which is used for etching the sub-layer may not attack the underlying material.

One of the advantages of the method according to the present invention is that the adherence of an oxide which has been obtained by anodic oxidation to the relevant metal often is excellent because said oxide is obtained by growing. The quality of the adherence is uniform and the width of the projecting part which depends on said adherence is thus accurately equal and readily reproducible. The adherence of aluminum oxide to aluminum is particularly good.

Aluminum is often used on silicon and, for example, on gallium arsenide and on gallium oxide.

It will be obvious that the width of the projecting part depends on the thickness of the etched metal. Accordingly, as the thickness of the sub-layer is larger, the width of the projecting part also becomes larger. The thickness of the sub-layer can thus be adapted to the geometry of the pattern and especially to the interspace between two adjacent conductor tracks. If said interspace is small, the width of the projecting part of the uppermost sub-layer must also be small and preferably a thin sub-layer is used.

With an initial thickness of an aluminum sub-layer of 0.07 to 1.2 $\mu$ in which an aluminum oxide layer is formed with a thickness in the order of 0.09 to 0.11 $\mu$, an aluminum layer thickness approximately 0.06 to 0.08 $\mu$ thick is converted into oxide. The aluminum is preferably etched in a bath on the basis of phosphoric acid, in which with the given thicknesses the resulting width of the projecting part has proved to be approximately 0.25 to 0.5 $\mu$.

Such a projecting part is very stable.

The layer thickness of the conductive material or of the conductive materials for the conductor pattern is preferably smaller than that of the aluminum which remains below the formed aluminum oxide. The thickness of the remaining aluminum preferably is at least approximately 0.7 $\mu$ and at most approximately 1 $\mu$.

In these circumstances the projecting part is sufficient to obtain an interspace between the edge of the auxiliary layer and the edge of the pattern.

It is possible to restrict the distance between two conductor tracks to 2 $\mu$m.

The only treatment which precedes the anodic oxidation is the formation of a mask of photosensitive material by means of conventionally used methods. Such a treatment must also be carried out in the described known method.

In general, photomasking treatments are considered to be polluting and it is endeavoured to restrict the required number of said operations.

It is to be noted that it may be annoying to use aluminum when at least one of the materials adjoining the surface contains aluminum which may be attacked during the removal of the aluminum sub-layer. In that case it is advised in particular to use titanium as an anodically oxidisable metal for the auxiliary layer. When GaAlAs is used, for example, titanium can be removed by means of a mixture on the basis of hydrofluoric acid.

An advantageous embodiment of the method according to the invention is furthermore characterized in that the anodic oxidation treatment is carried out locally while using a masking layer of photolacquer.

The anodic oxidation is preferably carried out in a bath containing tartaric acid or ammonium tartrate at 25° C for 1 to 5 minutes at a voltage of 60 to 80 volts.

The conductive layer of the conductor pattern preferably consists of several sub-layers. The lowermost sub-layer preferably consists of titanium, chromium, zirconium, cobalt, tungsten or tantalum and the upper layer is preferably of gold or of rhodium.

Between said two sub-layers it may sometimes be of advantage to use a third sub-layer which may consist, for example, of rhodium, platinum or palladium.

The present invention may be used in the manufacture of a conductor pattern of which certain parts serve as contacts with a given region of the semiconductor device, while other parts serve as connection conductors which are separated from the semiconductor body by an insulating layer. In that case the etching solution with which the auxiliary layer is removed should be selective relative to the insulating layer and relative to the semiconductor material.

The method according to the invention may be used advantageously for bounding the contacts in cases in which one or more photoetching treatments are to be avoided, for example, because the materials to be used cannot be etched selectively or with difficulty only relative to each other and/or the support. This is the case, for example, when using gold alloys having a substitution element as a doping impurity which is destined to obtain a given conductivity type on semiconductor compounds, in particular $A_{III}B_V$ compounds, for example, gallium phosphide. This is also the case with contact structures of a composite conductive layer which contain a sub-layer of refractory material which adheres rigidly to the semiconductor, for example titanium and a sub-layer of a rare metal, for example gold.

The invention will be described in greater detail with reference to the accompanying schematic drawings, FIGS. 1 to 6 show various stages in the manufacture of a device by means of the method according to the invention.

FIG. 1 shows a semiconductor body 1 having a substrate 2 of silicon and a protective layer 3 of silicon oxide. Said protective layer 3 is divided in the plane of the drawing into two layer portions 3a and 3b which bound a window 4 provided in the layer 3. The window 4 is present above a semiconductor region 5 which was previously formed in the substrate.

An aluminum layer 6 is vapour-deposited in a vacuum in a thickness of approximately 1 $\mu$m on the surface 1a of the body 1.

Figure 2:
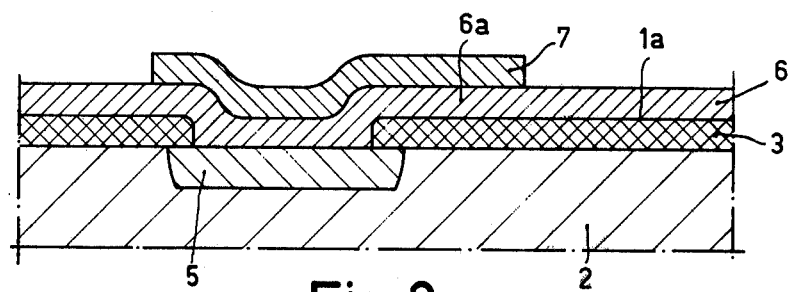

Provided on said aluminum layer 6 is a photosensitive lacquer layer of which after exposure and development a part 7 remains which has the same contours as the conductor pattern to be obtained. The body in this stage is shown in FIG. 2.

A dense layer 8 of aluminum oxide is provided on the free parts of the aluminum layer 6 by anodic oxidation. Said treatment is preferably carried out in a bath of tartaric acid or of ammonium tartrate at approximately 25° C. In accordance with the desired thickness said treatment takes two to five minutes at a voltage of 60 to 80 volts. Said bath does not attack the photolacquer mark 7 and the part 6a of the aluminum layer which is present below said mask 7.

Figure 3:
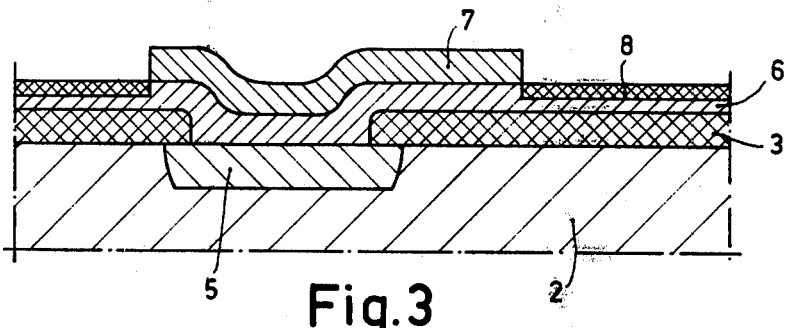

The layer 8 of aluminum oxide which is formed by converting an aluminum thickness in the order of 0.07 $\mu$ has a thickness in the order of 0.1 $\mu$, that is in the order of one tenth of the thickness of the aluminum. The body in this stage is shown in FIG. 3.

The photolacquer mask 7 is then removed and the part 6a of the aluminum layer 6 is etched, for example in a bath on the basis of phosphoric acid. In the plane of the drawing the etching treatment divides the aluminum layer and the aluminum oxide layer 8 each into two portions which are denoted by 6b and 6c and 8b and 8c, respectively. A recess 9 is obtained in which the pattern of conductors is then realised.

Figure 4:
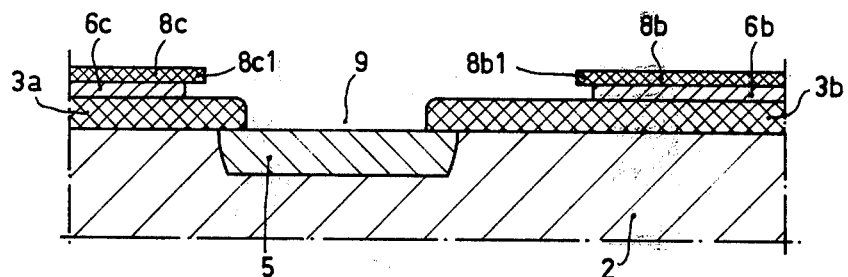

With the thickness of 1 $\mu$ of aluminum considered in this example the etching treatment lasts approximately 2 minutes in a mixture of 70% $H_3PO_4$, 3% $HNO_3$, 13% $CH_3COOH$ and 14% $H_2O$ which is heated at 55° C. Underetching then occurs which results in the formation of the projecting parts $8b_1$ and $8c_1$ of the aluminum oxide layer with a width in the order of 0.6 $\mu$. The body in this stage is shown in FIG. 4.

Provided on the surface of the body by vapour-deposition or cathode sputtering is a metal layer 10 which consists of three sub-layers: a sub-layer of titanium which adheres excellently to silicon and to silicon oxide, a sub-layer of rhodium which serves as a barrier between the sub-layer of titanium and the uppermost sub-layer of gold and which is of importance inter alia in connection with the adhesion of connections in a later stage. Said sub-layers are not shown in the figures. The overall thickness of the conductive layer is approximately 0.8 $\mu$m.

Figure 5:
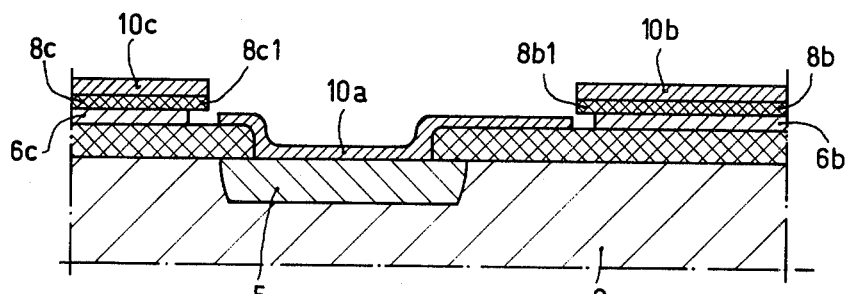

Due to the presence of the projecting parts $8b_1$ and $8c_1$ the layer 10 is separated in the plane of the drawing in the three portions, the portion 10a being present at the bottom of the recess 9 and the portions 10b and 10c being present on the portions 6b and 8b and the portions 6c and 8c, respectively, of the two sub-layers of the auxiliary layer. The body in this stage is shown in FIG. 5. Because the thickness of the layer 10 is approximately 0.8 $\mu$ and is approximately 0.1 $\mu$ smaller than that of the auxiliary layer, a space of regular dimensions remains below the projecting portions $8b_1$ and $8c_1$ so that the aluminum layer 6 is readily accessible for the solution with which the layer 6 is removed. For the removal is preferably used a solution containing per liter 20 to 30 g of $FeCl_3$ and 500 cc of HCl to which water is added, the duration of the etching treatment being approximately 4 minutes and the temperature of the solution being substantially equal to 25° C.

Figure 6:
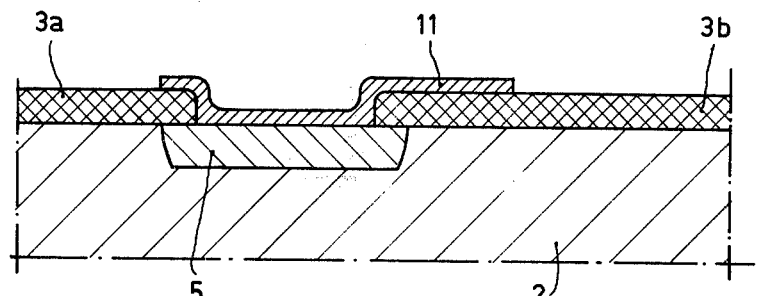

The body with the conductor pattern 11 which has been formed by means of the method according to the invention is shown in this stage in FIG. 6.

The semiconductor device may furthermore be assembled in the usual manner and, for example, be provided with a usual envelope.

What is claimed is:

1. A method of manufacturing a semiconductor device with a conductor pattern comprising the steps of: (a) providing a semiconductor body having a first surface (b) providing at said first surface an auxiliary layer having at least one recess in form of the said pattern, said auxiliary layer comprising at least two sub-layers, of which sub-layers the lowermost extends between said semiconductor body and the uppermost sub-layer, said sub-layers consisting of materials differing from each other and from that of the said pattern, said auxiliary layer being of an anodically oxidizable material, and said step of providing said sub-layers including subjecting said anodically oxidizable material to an anodic oxidation treatment to form said uppermost sub-layer (c) providing a discontinuous conductive layer of the material of said pattern over said auxiliary layer and in said at least one recess, and (d) removing the part of said conductive layer present on said auxiliary layer by selective dissolution of at least a part of said auxiliary layer, with the part of the conductive layer present in said recess remaining as the pattern.

2. A method as in claim 1, wherein said anodically oxidizable metal is aluminum.

3. A method as in claim 1, wherin said anodically oxidizable metal is titanium.

4. A method as in claim 1, wherein said anodic oxidation treatment is carried out locally with the anodically oxidizable material being maintained at the area where said pattern is to be provided, the remainder of the surface of said auxiliary layer being provided with an oxide layer, after which the maintained anodically oxidizable material is removed by selective etching at the area of the pattern to be provided so as to obtain the recess.

5. A method as in claim 4, wherein said local oxidation treatment is carried out with photolacquer layer.

6. A method as in claim 1, wherein said anodic oxidation treatment is carried out in a bath containing tartrate ions.

7. A method as in claim 1, wherein said discontinuous conductive layer comprises a first part disposed at said recess and a separate second part disposed at said auxiliary layer.

* * * * *